(12) United States Patent
Robertson

(10) Patent No.: US 6,699,771 B1
(45) Date of Patent: Mar. 2, 2004

(54) PROCESS FOR OPTIMIZING JUNCTIONS FORMED BY SOLID PHASE EPITAXY

(75) Inventor: Lance S. Robertson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/213,837

(22) Filed: Aug. 6, 2002

(51) Int. Cl.[7] ............................................... H01L 21/76
(52) U.S. Cl. ........................ 438/420; 438/486; 438/528; 438/530
(58) Field of Search .................. 438/407, 416, 438/418, 419, 420, 480, 482, 486, 528, 530

(56) References Cited

U.S. PATENT DOCUMENTS

| | | | | |
|---|---|---|---|---|
| 5,407,838 A | * | 4/1995 | Ohnishi et al. ............. | 438/528 |
| 5,885,886 A | * | 3/1999 | Lee ............................. | 438/528 |
| 5,994,175 A | * | 11/1999 | Gardner et al. ............. | 438/305 |
| 6,069,062 A | * | 5/2000 | Downey ...................... | 438/528 |
| 6,521,502 B1 | * | 2/2003 | Yu .............................. | 438/528 |
| 2002/0187614 A1 | * | 12/2002 | Downey ...................... | 438/528 |

* cited by examiner

Primary Examiner—Chandra Chaudhari
(74) Attorney, Agent, or Firm—Peter K. McLarty; W. James Brady, III; Frederick J. Telecky, Jr.

(57) ABSTRACT

A method of forming a semiconductor device includes forming at least one amorphous region within an at least partially formed semiconductor device. The method also includes implanting a halogen species in the amorphous region of the at least partially formed semiconductor device. The method further includes doping at least a portion of the at least one amorphous region to form at least one junction within the at least partially formed semiconductor device. The method also includes performing solid phase epitaxial re-growth to activate the doped portion of the at least one amorphous region of the at least partially formed semiconductor device.

11 Claims, 2 Drawing Sheets

PROCESS FOR OPTIMIZING JUNCTIONS FORMED BY SOLID PHASE EPITAXY

TECHNICAL FIELD OF THE INVENTION

This invention relates generally to the field of semiconductor devices and, more particularly, to a method for optimizing junctions formed by solid phase epitaxy.

BACKGROUND

As semiconductor manufacturers continue to reduce the scale of semiconductor devices, the junction depth associated with the junction areas likewise tends to decrease. Conventional methods for activating a majority of the dopants within the junction areas of the semiconductor device typically require a high temperature anneal, which often leads to increased dopant diffusion from the junction areas. Methods to reduce the junction depth often result in an increase in semiconductor device sheet resistance and a lower semiconductor device drive current.

SUMMARY

In one method embodiment, a method of forming a semiconductor device comprises forming at least one amorphous region within an at least partially formed semiconductor device. The method also comprises implanting a halogen species in the at least one amorphous region of the at least partially formed semiconductor device. The method further comprises doping at least a portion of the at least one amorphous region to form at least one junction within the at least partially formed semiconductor device. The method also comprises activating the doped portion of the at least one amorphous region of the at least partially formed semiconductor device by solid phase epitaxial re-growth.

In one embodiment, a transistor is formed using a method. The method comprises implanting at least a halogen species within an at least partially formed semiconductor device to form at least one amorphous region. The method also comprises doping at least a portion of the at least one amorphous region to form at least one junction within the at least partially formed semiconductor device. The method further comprises activating the doped portion of the at least one amorphous region of the at least partially formed semiconductor device by solid phase epitaxial re-growth.

Depending on the specific features implemented, particular embodiments of the present invention may exhibit some, none, or all of the following technical advantages. Various embodiments minimize leakage current from the junction areas of the semiconductor device after solid phase epitaxial re-growth. Some embodiments may increase the gradient of boron concentration after solid phase epitaxial regrowth.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which.

DETAILED DESCRIPTION OF EXAMPLE EMBODIMENTS

FIGS. 1A through 1F are cross-sectional views showing one example of a method of forming a portion of semiconductor device 10. Semiconductor device 10 may be used as a basis for forming any of a variety of semi-conductor devices, such as a bipolar junction transistor, a NMOS transistor, a PMOS transistor, a CMOS transistor, or other semiconductor based devices. Particular examples and dimensions specified throughout this document are intended for example purposes only, and are not intended to limit the scope of the present disclosure. Moreover, the illustration in FIGS. 1A through 1F are not intended to be to scale.

One aspect of this disclosure recognizes that implanting a halogen species in an amorphous region (to be formed later) of semiconductor device 10 can minimize lattice defects in the amorphous region. Implanting a halogen species in the amorphous region of semiconductor device 10 can alleviate some of the problems conventionally associated with the lattice defects in the amorphous regions of the semiconductor device.

Figure 1A:
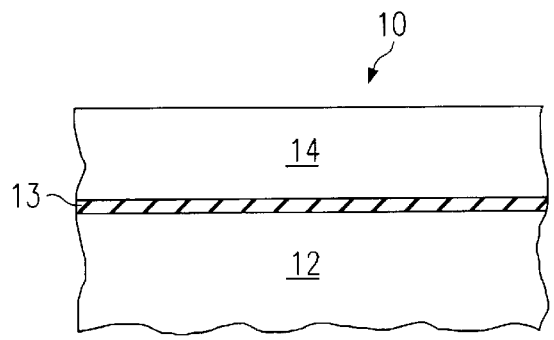
FIGS. 1A through 1F are cross sectional views illustrating one example of a method of forming a portion of a semiconductor device.

FIG. 1A shows a cross sectional view of semiconductor device 10 after formation of a gate dielectric layer 13 disposed outwardly from a semiconductor substrate 12 and after formation of a gate electrode layer 14 outwardly from gate dielectric layer 13. Although gate dielectric layer 13 and gate electrode layer 14 are shown as being formed without interstitial layers between them, such interstitial layers could alternatively be formed without departing from the scope of the present disclosure. Semiconductor substrate 12 may comprise any suitable material used in semiconductor chip fabrication, such as silicon or germanium. Gate dielectric layer 13 may comprise, for example, oxide, silicon dioxide, or oxi-nitride.

Forming gate dielectric layer 13 may be effected through any of a variety of processes. In one non-limiting example, gate dielectric layer 13 can be formed by growing an oxide. Using a grown oxide as gate dielectric layer 13 is advantageous in providing a mechanism for removing surface irregularities in semiconductor substrate 12. For example, as oxide is grown on the surface of substrate 12, a portion of substrate 12 is consumed, including at least some of the surface irregularities.

At some point, the active areas of semiconductor device 10 can be formed. Active areas of semiconductor device 10 may be formed, for example, by doping those areas to adjust the threshold voltage $V_t$ of semiconductor device 10. This doping may comprise, for example, ion implantation through gate dielectric layer 13. In an alternative embodiment, doping of the active regions of semiconductor device 10 can occur before formation of gate dielectric layer 13. In one particular embodiment (not explicitly shown), a sacrificial dielectric layer may be disposed before formation of gate dielectric layer 13. In that case, the active regions of semiconductor device 10 are doped by implantation through the sacrificial dielectric layer. Then, the sacrificial dielectric layer is removed, and gate dielectric layer 13 is formed.

Gate electrode layer 14 may comprise, for example, amorphous silicon or polysilicon. In this example, gate electrode layer 14 comprises polysilicon. Forming gate electrode layer 14 may be effected, for example, by depositing polysilicon.

In some embodiments, after forming gate electrode layer 14, gate electrode layer 14 may be doped to achieve a desired gate to junction capacitance. Gate electrode layer 14 may be doped through any of a variety of processes, such as, for example, by ion implantation. In various embodiments, ion implantation of gate dielectric layer 14 may comprise, for example, a boron dopant, a phosphorous dopant, and/or an arsenic dopant.

Figure 1B:
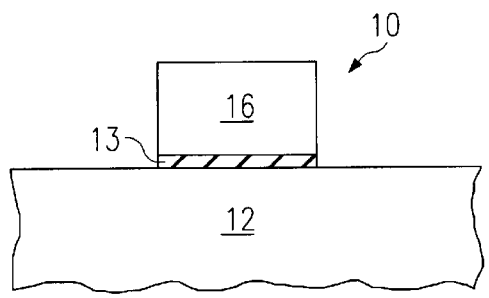

FIG. 1B shows a cross sectional view of semiconductor device 10 after formation of a semiconductor gate 16 outwardly from substrate 12. Forming semiconductor gate 16 may be effected through any of a variety of processes. For example, semiconductor gate 16 can be formed by patterning and etching gate electrode layer 14 and gate dielectric layer 13 using photo resist mask and etch techniques.

Figure 1C:
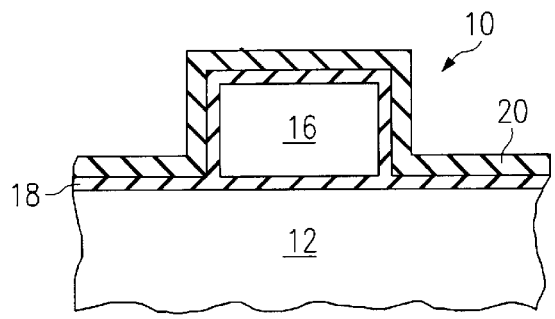

FIG. 1C shows a cross sectional view of semiconductor device 10 after formation of a first screen dielectric layer 18 outwardly from semiconductor substrate 12 and after formation of a first spacer layer 20 outwardly from first screen dielectric layer 18. Although first screen dielectric layer 18 and first spacer layer 20 are shown as being formed without interstitial layers between them, such interstitial could alternatively be formed without departing from the scope of the present disclosure. First screen dielectric layer 18 may comprise, for example, silicon oxide or silicon oxi-nitride.

Forming first screen dielectric layer 18 may be effected through any of a variety of processes. For example, first screen dielectric layer 18 can be formed by growing an oxide. In this particular embodiment, first screen dielectric layer 18 combines with gate dielectric layer 13 during the formation of layer 18. Using a grown oxide as first screen dielectric layer 18 is advantageous in providing a mechanism for removing surface irregularities in substrate 12 and semiconductor gate 16 created during the formation of gate 16.

First spacer layer 20 may comprise any dielectric material, such as, for example, silicon nitride, silicon oxi-nitride, or silicon oxide. Forming first spacer layer 20 may be effected through any of a variety of processes. In one non-limiting example, first spacer layer 20 can be formed by depositing a silicon nitride.

In the illustrated embodiment, first screen dielectric layer 18 comprises a dielectric material that is selectively etchable from first spacer layer 20. That is, each of first screen dielectric layer 18 and first spacer layer 20 can be removed using an etchant that does not significantly affect the other. In one non-limiting example, first screen dielectric layer 18 may comprise a layer of silicon oxide while first spacer layer 20 may comprise silicon nitride. In an alternative embodiment, first spacer layer 20 can comprise a dielectric material that is incapable of being selectively etched from first screen dielectric layer 18.

In this particular embodiment, first spacer layer 20 is formed outwardly from first screen dielectric layer 18. In an alternative embodiment, the thickness of first screen dielectric 18 may be increased to a point that substantially negates the need for the formation of first spacer layer 20 outwardly from first screen dielectric layer 18. In this example, the formation of first screen dielectric layer 18 may be effected, for example, by growing a silicon oxide, by depositing a silicon oxide, or a combination of growing and depositing a silicon oxide.

Figure 1D:
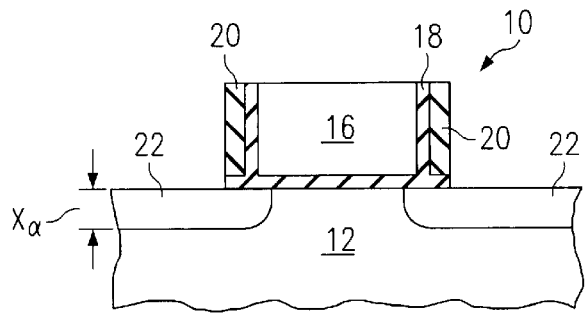

FIG. 1D shows a cross sectional view of semiconductor device 10 after removal of at least a portion of first screen dielectric layer 18 and at least a portion of first spacer layer 20, and after formation of amorphous regions 22. Portions of first screen dielectric layer 18 and first spacer layer 20 may be removed, for example, by anisotropically etching first screen dielectric layer 18 and first spacer layer 20. In one non-limiting example, portions of first screen dielectric layer 18 and first spacer layer 20 are removed by performing a plasma etch.

In this embodiment, portions of first screen dielectric layer 18 disposed outwardly from amorphous regions 22 are completely removed. In an alternative embodiment, portions of first screen dielectric layer 18 remain disposed outwardly from amorphous regions 22 after removal of portions of layers 18 and 20. Leaving at least a portion of first screen dielectric layer 18 disposed outwardly from amorphous regions 22 can be advantageous in reducing surface irregularities of substrate 12 formed during the etching process.

Amorphous regions 22 of semiconductor device 10 can be formed by any of a variety of processes. In one non-limiting example, amorphous regions 22 of semiconductor device 10 can be formed by ion implantation. In various embodiments, amorphous regions 22 can be formed by implanting a dopant species capable of changing the phase of at least a portion of substrate 12 from a crystalline phase to an amorphous phase. The species implanted to form amorphous regions 22 may comprise, for example, a silicon species, a germanium species, and/or a halogen species. The dose and implantation energy utilized to form amorphous regions 22 depends at least in part on a desired amorphous region depth ($X_\alpha$) and the dopant species used to form amorphous regions 22. The amorphous region depth ($X_\alpha$) depends at least in part on a desired junction depth ($X_j$) of device 10.

At some point, amorphous regions 22 of semiconductor device 10 can be formed. In various embodiments, amorphous regions 22 can be formed before forming screen dielectric layer 18 and first spacer layer 20. In some embodiments, amorphous regions 22 can be formed before removal of portions of first screen dielectric layer 18 and first spacer layer 20. In other embodiments, amorphous regions 22 may be formed after removal of at least a portion of first screen dielectric layer 18 and first spacer layer 20.

One aspect of this disclosure recognizes that implanting a halogen species in amorphous regions 22 can minimize lattice defects (e.g., dangling bonds and/or un-bonded orbitals) formed in amorphous regions 22 during ion implantation. Implanting a halogen species in amorphous regions 22 of semiconductor device 10 can alleviate some of the problems conventionally associated with the lattice defects in the amorphous regions of the semiconductor device.

Conventional methods of forming the amorphous regions in the substrate of the semiconductor device often lead to lattice defects within the material used to form the semiconductor substrate. Lattice defects in the material can result in the formation of carrier generation-recombination centers in the space-charge region of the electrical junctions of the device after solid phase epitaxial re-growth. The formation of these carrier generation recombination centers can result in the formation of leakage current within the device, which can degrade the semiconductor device performance.

Unlike conventional methods, semiconductor device 10 implants a halogen species within amorphous regions 22. Implanting a halogen species into amorphous regions 22 enables device manufacturers to reduce the formation of carrier generation recombination centers in the space-charge region of the electrical junctions after solid phase epitaxial re-growth. The use of a halogen species in amorphous regions 22 provides the advantage of minimizing lattice defects in the space-charge region of the electrical junctions after solid phase epitaxial re-growth. Minimizing lattice defects in the space-charge region of the electrical junctions is advantageous in minimizing leakage current from device 10.

In this particular embodiment, amorphous regions 22 are formed by implanting fluorine at an implantation dose of approximately $5\times10^{14}$ cm$^{-2}$ to $1\times10^{16}$ cm$^{-2}$ and an implantation energy of approximately 1 to 200 keV. In that case, the fluorine operates to minimize lattice defects in amorphous regions 22 by bonding to dangling bonds, un-bonded orbitals, and/or any other lattice defect within the space-charge region of the electrical junctions.

In this example, the implantation of a fluorine species within semiconductor device 10 occurs during the formation of amorphous regions 22. In an alternative embodiment, the implantation of a fluorine species can occur substantially simultaneously with or after the formation of amorphous regions 22. In that embodiment, amorphous regions 22 can be formed by implanting a silicon species and/or a germanium species within semiconductor device 10. In that case, the formation of amorphous regions 22 can comprise implanting silicon and/or germanium at an implantation dose of approximately $1\times10^{14}$ cm$^{-2}$ to $1\times10^{16}$ cm$^{-2}$ and an implantation energy of approximately 5 keV to 50 keV. In addition, the fluorine species can be implanted at an implantation dose of approximately $5\times10^{13}$ cm$^{-2}$ to $1\times10^{16}$ cm$^{-2}$ and an implantation energy of approximately 1 to 200 keV.

Figure 1E:
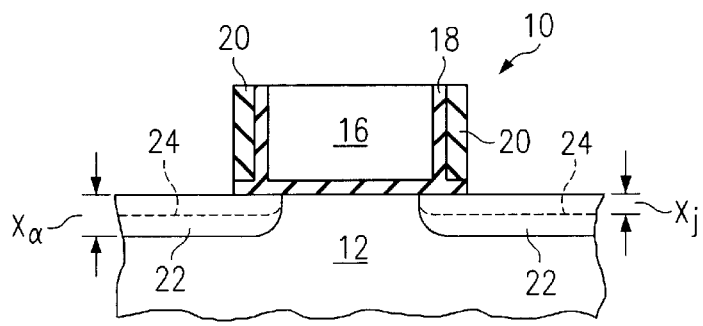

FIG. 1E shows a cross sectional view of semiconductor device 10 after formation of junction areas 24 within amorphous regions 22. Junction areas 24 can comprise, for example, a source and a drain, or a source extension and a drain extension. In various embodiments, junction areas 24 may comprise a relatively high-doping concentration of boron, phosphorous, and/or arsenic dopants. The dopant concentration of junction areas 24 depends at least in part on the desired sheet resistance of semiconductor device 10. Increasing the dopant concentration in junction areas 24 typically results in a lower sheet resistance of semiconductor device 10.

Junction areas 24 of semiconductor device 10 can be formed by any of a variety of processes. In one non-limiting example, junction areas 24 of semiconductor device 10 can be formed by ion implantation. The dopant implanted to form junction areas 24 can comprise, for example, a boron dopant, a phosphorous dopant, an arsenic dopant, or a combination of these or other dopants. The dose and implantation energy utilized to form junction areas 24 depends at least in part on a desired junction depth ($X_j$) and the dopant used to form junction areas 24. In this particular embodiment, junction areas 24 are formed by implanting boron at an implantation dose of approximately $1\times10^{14}$ cm$^{-2}$ to $4\times10^{15}$ cm$^{-2}$ and at an implantation energy of approximately 200 eV to 2 keV.

The junction depth ($X_j$) of junction areas 24 depends at least in part on a gate length associated with semiconductor gate 16. Reducing the gate length of gate 16 typically results in shallower junction depths ($X_j$) of junction areas 24. In this example, junction areas 24 comprise a junction depth ($X_j$), after dopant activation, of three hundred (300) Angstroms or less.

At some point, junction areas 24 of semiconductor device 10 can be formed. Junction areas 24 may be formed, for example, after formation of amorphous regions 22, and before removal of portions of first screen dielectric layer 18 and first spacer layer 20. In another embodiment, extension areas 22 may be formed after formation of amorphous regions 22, and after removal of at least a portion of first screen dielectric layer 18 and first spacer layer 20.

In this example, the implantation of a fluorine species within semiconductor device 10 occurs during formation of amorphous regions 22. In an alternative embodiment, the implantation of a fluorine species can occur after the formation of junction areas 24. In that case, the fluorine species can be implanted at an implantation dose of approximately $5\times10^{13}$ cm$^{-2}$ to $1\times10^{16}$ cm$^{-2}$ and an implantation energy of approximately 1 to 200 keV.

One aspect of this disclosure recognizes that forming amorphous regions 22 with an amorphous depth ($X_\alpha$) that is greater than or equal to the junction depth ($X_j$) can result in improved activation of the dopants in junction areas 24. Forming an amorphous region depth ($X_\alpha$) that is greater than or equal to the junction depth ($X_j$) can alleviate some of the problems conventionally associated with the activation of dopants in the junction areas of the semiconductor device.

Conventional methods for minimizing the impact of lattice defects of the material used to form the semiconductor substrate often lead junction depths ($X_j$) that are greater than the amorphous region depth ($X_\alpha$). A junction depth ($X_j$) that is greater than the amorphous region depth ($X_\alpha$) typically results in reduced dopant activation during solid phase epitaxial re-growth. Reducing dopant activation in the junction areas of the semiconductor device can result in an increase in semiconductor sheet resistance and a junction depth ($X_j$) that is not optimal.

Unlike the conventional methods, semiconductor device 10 implements an amorphous depth ($X_\alpha$) that is greater than or equal to the junction depth ($X_j$). Implementing an amorphous depth ($X_\alpha$) that is greater than or equal to the junction depth ($X_j$) enables device manufacturers to optimize junction areas 24 by increasing dopant activation in junction areas 24 during solid phase epitaxial re-growth. The optimization of dopant activation in junction areas 24 enables device manufacturers to obtain a lower sheet resistance, a desired drive current, and/or a relatively high gate to junction capacitance.

Although increasing the amorphous region depth ($X_\alpha$) can increase the number of lattice defects in the space-charge region of junction areas 24, device 10 counteracts this effect by implanting a halogen species into amorphous regions 22. Implanting a halogen species into amorphous regions 22 tends to minimize the amount of lattice defects in the space-charge regions of junction areas 24 because the halogen species tends to bond to the lattice defects.

Figure 1F:
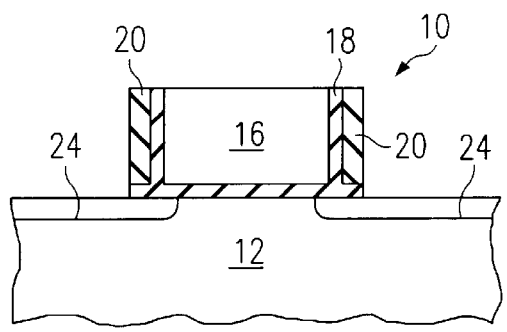

FIG. 1F is a cross-sectional view of semiconductor device 10 after activation of the dopants in junction areas 24. The dopants of junction areas 24 can be activated by any of a number of processes, such as, for example, by solid phase epitaxial re-growth. The solid phase epitaxial re-growth process converts the amorphous phase of the material in amorphous regions 22 to a crystalline phase. In other words, solid phase epitaxial re-growth re-crystallizes that portion of substrate 12 converted to an amorphous phase during implantation of amorphous regions 22. This re-crystallization process operates to activate the dopants within junction areas 24.

One aspect of this disclosure recognizes that activation of a majority of the dopants within junction areas 24 can occur at a relatively low temperature. Activating a majority of the dopants within junction areas 24 of semiconductor device 10 at a relatively low temperature can alleviate some of the problems conventionally associated with dopant diffusion during relatively high temperature activation.

As semiconductor manufacturers continue to reduce the scale of semiconductor devices, the junction depth ($X_j$) associated with the junction areas likewise tends to decrease. Conventional methods for activating a majority of the dopants within the junction areas of the semiconductor device typically require a relatively high temperature anneal (e.g., 1000 to 1100 degrees Celsius). Activating the dopants within the junction areas with a relatively high temperature anneal often leads to increased dopant diffusion, which can lead to junction depths that are deeper than desired. To counteract this effect, conventional methods often reduce the dopant concentration within the junction areas and/or the implantation energy of the dopants. Reducing the dopant concentration of the junction areas typically results in an increase in semiconductor device sheet resistance, a lower semiconductor device drive current, and/or a reduced gate to junction capacitance.

Unlike conventional methods, dopant activation of junction areas 24 occurs in a relatively low temperature environment. Activating the dopants in a relatively low temperature environment enables device manufacturers to minimize dopant diffusion from junction areas 24. Minimizing dopant diffusion from junction areas 24 advantageously allows device manufacturers to obtain a relatively shallow junction depth ($X_j$) while obtaining a desired sheet resistance. In various embodiments, device manufacturers can obtain a junction depth of three hundred (300) Angstroms or less, and a sheet resistance of approximately five hundred (500) to one thousand (1000) ohms/sq.

In this example, the amorphous depth ($X_\alpha$) is greater than or equal to the junction depth ($X_j$). The amorphous phase of the material in amorphous regions 22 comprises a relatively higher energy state than the energy state of a crystalline phase of the material. Consequently, activating the dopants within junction areas 24 by using solid phase epitaxial re-growth (e.g., converting the amorphous phase to a crystalline phase) advantageously enables device manufacturers to activate the dopants at a relatively lower temperature. In this particular embodiment, the activation of the dopants in junction areas 24 comprises solid phase epitaxial re-growth at a temperature of approximately 500 to 700 degrees Celsius.

Figure 2:
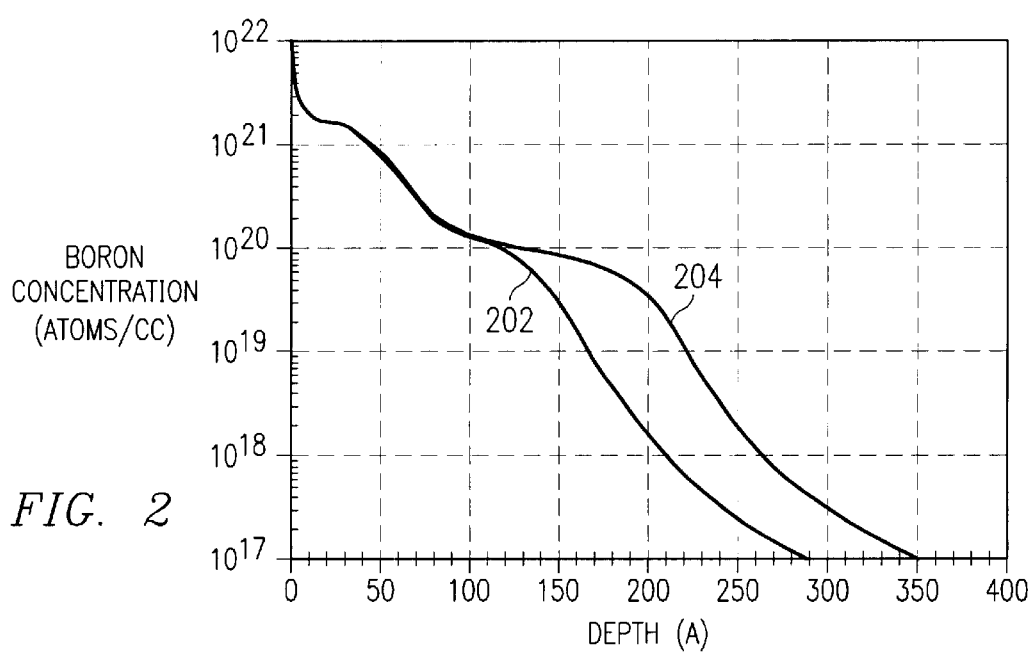
FIG. 2 is a graph comparing the boron diffusion during solid phase epitaxial re-growth of a semiconductor device with a fluorine-based amorphous region to a semiconductor device without a fluorine-based amorphous region.

FIG. 2 is a graph comparing the boron diffusion during solid phase epitaxial re-growth of a semiconductor device with a fluorine-based amorphous region to a semiconductor device without a fluorine-based amorphous region. In this example, line 202 represents the diffusion of boron in the semiconductor device without the fluorine-based amorphous region. Line 204 represents the diffusion of boron in the semiconductor device with the fluorine-based amorphous region. In this particular example, the fluorine-based amorphous region is implanted with fluorine at an implantation dose of approximately $1 \times 10^{15}$ cm$^{-2}$ and an implantation energy of approximately 12 keV. The horizontal axis represents the vertical diffusion of the boron dopants, while the vertical axis represents the concentration of the boron dopants in the junction areas of each device.

In this example, each semiconductor device includes an amorphous region formed by implanting germanium at an implantation dose of approximately $5 \times 10^{14}$ cm$^{-2}$ and an implantation energy of approximately 48 keV. Each semiconductor device also includes a junction area implanted with boron ions at an implantation dose of approximately $1.2 \times 10^{15}$ cm$^{-2}$ and an implantation energy of approximately 700 eV. In addition, the boron ions implanted in each semiconductor device are activated by solid phase epitaxial re-growth at a temperature of approximately six hundred fifty (650) degrees Celsius for approximately five (5) minutes.

This graph illustrates that implanting a fluorine species within the amorphous region of a semiconductor device can result in increased dopant diffusion from the junction areas during solid phase epitaxial re-growth. Device manufacturers can control the dopant diffusion from the junction areas by varying the concentration of the fluorine species. Increasing the concentration of fluorine tends to increase dopant diffusion from the junction areas. In addition, varying the concentration and implantation energy of the fluorine species can allow device manufacturers to optimize the dopant concentration profile within the junction areas. In other words, varying the concentration and implantation energy of fluorine can allow device manufacturers to balance the effects of fluorine on diffusion and the benefits of fluorine in minimizing leakage current from the device. Similar results and benefits can be realized by implementing a halogen-based amorphous region.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. A method of forming a semiconductor device, comprising:

forming at least one amorphous region within an at least partially formed semiconductor device to a depth of $X_\alpha$;

implanting a halogen species in the at least one amorphous region of the at least partially formed semiconductor device;

doping at least a portion of the at least one amorphous region to form at least one junction to a depth $X_j$ within the at least partially formed semiconductor device such that $X_j$ is less than $X_\alpha$; and activating the doped portion of the at least one amorphous region of the at least partially formed semiconductor device by solid phase epitaxial re-growth.

2. The method of claim 1, wherein forming the amorphous region comprises implanting a species selected from the group consisting of silicon and germanium.

3. The method of claim 1, wherein the halogen species comprises a species selected from the group consisting of fluorine and chlorine.

4. The method of claim 1, wherein the halogen species is implanted after forming the amorphous region.

5. The method of claim 1, wherein the halogen species is implanted substantially simultaneously with forming the at least one amorphous region.

6. The method of claim 1, wherein the at least one junction comprises a region selected from the group consisting of a drain region, a source region, and an extension region.

7. The method of claim 1, wherein the at least one junction is doped with a dopant selected from the group consisting of boron, phosphorous, and arsenic.

8. A method of forming a semiconductor device, comprising:

implanting at least a halogen species within an at least partially formed semiconductor device to form at least one amorphous region to a depth $X_\alpha$;

doping at least a portion of the at least one amorphous region to form at least one junction to a depth $X_j$ within the at least partially formed semiconductor device such that $X_j$ is less than $X_\alpha$; and activating the doped portion of the at least one amorphous region of the at least partially formed semiconductor device by solid phase epitaxial re-growth.

9. The method of claim 8, wherein the at least one amorphous region is implanted with the at least a halogen species and at least a germanium species.

10. The method of claim 8, wherein the at least a halogen species comprises fluorine.

11. The method of claim 8, wherein the at least one junction is doped with at least a boron dopant.

* * * * *